United States Patent [19]

Orihara

[11] Patent Number: 5,212,660

[45] Date of Patent: May 18, 1993

[54] DIGITAL FILTER HAVING A SWITCHING MATRIX AND ADDERS

[75] Inventor: Junichi Orihara, Ichihara, Japan

[73] Assignee: Kawasaki Steel Corporation, Hyogo, Japan

[21] Appl. No.: 760,324

[22] Filed: Sep. 16, 1991

[30] Foreign Application Priority Data

Sep. 20, 1990 [JP] Japan .................. 2-251315

[51] Int. Cl.$^5$ .............................................. G06F 15/31
[52] U.S. Cl. ................................................ 364/724.16
[58] Field of Search ................................... 364/724.16

[56] References Cited

U.S. PATENT DOCUMENTS

| | | | |
|---|---|---|---|
| 4,641,259 | 2/1987 | Shan et al. | 364/724.16 |
| 4,700,345 | 10/1987 | Morcom et al. | 364/724.16 |
| 4,771,395 | 9/1988 | Kyokai | 364/724.16 |
| 4,811,259 | 3/1989 | Costas | 364/724.16 |
| 4,933,891 | 6/1990 | Schenk | 364/724.16 |
| 5,034,907 | 7/1991 | Johnson et al. | 364/724.16 |
| 5,040,137 | 8/1991 | Sherrill | 364/724.16 |
| 5,050,119 | 9/1991 | Lish | 364/724.16 |

Primary Examiner—David H. Malzahn
Attorney, Agent, or Firm—Oliff & Berridge

[57] ABSTRACT

In a digital filter, a plurality of delay elements $D_1$–$D_n$ are serially connected to one another, and taps for obtaining delay signals being different in delay time from one another are provided at respective connecting portions. Outputs from a plurality of multipliers $M_0$–$M_3$ are added together by an adder A, and the result is outputted to an output terminal of the digital filter. Signal selecting means $S_{00}$–$S_{3n}$ are switched on or off between the plurality of taps and the input terminals of the plurality of multipliers. The multipliers $M_0$–$M_3$ can be connected to optional taps, and, by use of a relatively small number of multipliers, a plurality of delay signals being different in delay time from one another are formed into a composite output signal while the delay times and the signal levels being widely selected.

4 Claims, 16 Drawing Sheets

DIGITAL FILTER HAVING A SWITCHING MATRIX AND ADDERS

BACKGROUND OF THE INVENTION

1. Field of the Invention

This invention relates to a digital filter wherein a plurality of delay elements are used to obtain an output signal composed of a plurality of delay signals being different in delay time and different in signal level from one another, and more particularly, to improvements in the digital filter capable of decreasing the number of multipliers utilized in the digital filter and of reducing the costs.

2. Description of the Prior Art

There has heretofore been known that a transfer function of a predetermined frequency response can be realized by an impulse response of a certain type. Furthermore, there have been known various theories wherein the impulse response of the transfer function forming the predetermined frequency response as described above is sought for utilizing it in electronic components and the like.

In order to obtain the predetermined frequency response in accordance with the above-described theories, a digital filter is obtained in such a manner that a plurality of delay elements are used to obtain an output signal composed of a plurality of delay signals which are different in delay time from one another and which are different in signal level from one another, so that the filter having the corresponding impulse response can be realized.

Digital filters using the plurality of delay elements as described above, are known as finite impulse response filters (hereinafter referred to as a "FIR filter") and infinite impulse response filters (hereinafter referred to as an "IIR filter").

Incidentally, differences and similarities between the FIR filter and the IIR filter will be described later with reference to FIGS. 17 and 18.

FIG. 13 is a block diagram showing the conventional FIR filter.

In this FIG. 13, delay elements $D_1$-$D_n$ totalling to n are serially connected to one another, and taps totalling to n+1 are provided at respective connecting portions in order to obtain delay signals having various delay times. Furthermore, a filter input signal inputted through an input terminal IN is inputted into input terminals of the delay element $D_1$ and a multiplier $M_0$. Further, multipliers $M_0$-$M_n$ totalling to n+1, capable of receiving delay signals different in delay time from one another and of obtaining delay output signals each having an optional signal level are provided at the taps, respectively. The delay output signals from the multipliers totalling to n+1 are added together by an adder A and outputted into an output terminal OUT as a filter output signal.

In the above-described FIR filter, delay signals are obtained from the taps on the output sides of the delay elements, the said taps being located at predetermined positions from the input terminal IN (i.e., predetermined delay times), and these predetermined delay signals are turned into delay output signals each having a desired signal, level, by the multipliers disposed at the respective taps, whereby all of these delay output signals are added together by the adder, thus obtaining a final filter output. With this arrangement, in the above-described FIR filter, the filter output signal having a desired impulse response can be obtained for the filter input signal inputted into the input terminal IN.

In FIG. 13, the filter input signal inputted through the input terminal IN is data continued at intervals of a predetermined sampling time Ts. Furthermore, the FIR filter in FIG. 13 performs the digital process in accordance with a clock having a cycle of the above-described sampling time Ts. The data being filtered (i.e., the input signal inputted through the input terminal IN) is inputted into the delay element $D_1$ and successively shifted to the delay elements $D_2$ . . . $D_n$ with every clock.

Incidentally, when the FIR filter shown in this FIG. 13 is used for the image processing by the NTSC (National Television System Committee) method, 4 fsc=14.3 MHz is frequently used as the frequency of the clock, i.e., sampling frequency in accordance with a subcarrier frequency fsc=3.58 MHz.

Incidentally, these delay elements $D_1$-$D_n$ are registers for storing words of a predetermined bit number, e.g., 8 bit words, and perform fixed delaying by one clock sampling time, Ts.

Data of delay times in accordance with the number of the delay elements $D_1$-$D_n$ which have passed can be obtained from the taps disposed between the delay elements $D_1$-$D_n$. Namely, a signal (data) delayed by a time (n×Ts) can be obtained from the tap on the output side of the number n delay element $D_n$.

These taps are connected with the multipliers $M_0$-$M_n$ corresponding thereto, and coefficients $a_0$-$a_n$ set at every multiplier $M_0$-$M_n$ are applied to the signals (data) from the taps.

Incidentally, these coefficients $a_0$-$a_n$ are coefficients for about 8-10 bits. Furthermore, as the multipliers $M_0$-$M_n$, parallel multipliers are normally used for high speed processing. For example, when the clock frequency of the above-mentioned clock is set at 14.3 MHz, the clock cycle (sampling time Ts) becomes (1/14.3 MHz=70 ns), so that the operational speeds of the multipliers $M_0$-$M_n$ must be faster than 70 ns.

Incidentally, the above-described parallel multipliers perform the operations in a substantially parallel manner to one another about the figures of multipliers and the figures of multiplicands, whereby many logical gates are required, and, in the parallel multipliers of 8×8 or 8×10 bit class, about 1000 gates are required.

In FIG. 13, all of the outputs from the multipliers $M_o$-$M_n$ are added together by the adder A, and the result is outputted from the output terminal OUT. Additionally, the results of multiplying outputted from the multipliers $M_o$-$M_n$ are data of 16-18 bits, the adder A can perform adding of 16-18 bits, and the result can be outputted from the output terminal OUT.

Incidentally, the operation performed in the FIR filter shown in FIG. 13 can be expressed as in the following equation where the number input at the intervals of sampling time Ts is $X_k$, an output thereof is $Y_k$ and coefficients applied at the multipliers $M_o$-$M_n$ are $a_0$-$a_n$, respectively.

$$Y_k = \sum_{i=0}^{n} (a_i X_{k-i}) \quad (1)$$

Incidentally, the above-described operations are the operations called convolution, and, the operations of this type can give some characteristic of frequency to the digital filter. Furthermore, this characteristics of frequency can be determined by way of a coefficient $a_i$.

Furthermore, there have heretofore been disclosed techniques of removing a ghost signal from a signal received by a television to improve a ghost screen by use of various filters.

FIG. 14 is an explanatory view showing the ghost screen wherein the ghost signal is superimposed on the signal received together with the main signal.

In FIG. 14, an image $I_0$ is a real image by the main signal, and an image $I_1$ is a ghost image created by the ghost signal which has been superimposed on the main signal in the signals received.

A value $t_a$ of a shift between the real image and the ghost image is determined by a lag time or a lead time of the ghost signal which has been superimposed on the original signal. The ghost shifted to the right like the image $I_1$ relative to the image $I_0$ in FIG. 14 is called a post-ghost. On the other hand, the ghost shifted to the left in the screen is called a pre-ghost. This pre-ghost appears when the ghost signal is more advanced in the electric wave propagation than the original signal. However, out of the electric waves propagated by the delay times different from one another, the most intensive signal is the main signal, so that the above-described pre-ghost may appear.

Incidentally, FIG. 14 presupposes the NTSC method, whereby the horizontal scan from left to right is successively performed from to top to bottom. Furthermore, a horizontal scan cycle $T_h$ is 63.5 microseconds, about 80% of the horizontal scan is displayed in the screen, and the right and left portions of the horizontal scan, which are not displayed on the screen, are called horizontal blankings.

FIG. 15 is a view of electric wave propagation for explaining the process of generation of the ghost.

In FIG. 15, a direct wave B of the broadcast wave radiated from a broadcast station 20 reaches an antenna 24 by the shortest distance. On the other hand, parts of the broadcast wave radiated from the broadcast station 20 reach the receiving antenna 24 as reflected waves C and D reflected at concrete and steel buildings 22a and 22b. Since these reflected waves C and D are propagated for distances longer than the distance of propagation of the direct wave B, the propagation times thereof become longer then that of the direct wave B. Furthermore, since the surfaces reflecting the broadcast wave of the concrete and steel buildings 22a and 22b have some spaces, the propagation times of the reflected waves C and D have spreads, respectively, whereby the reflected waves C and D are turned into composite signals each including a multiplicity of reflected waves having propagation times close to one another. Accordingly, the received signal in the receiving antenna 24, becomes a signal which has been superimposed on not only the main signal but also the ghost signal having the delayed time.

FIG. 16 shows the wave forms of the original signal and the received signal in which the ghost signal is superimposed on the main signal corresponding to the original signal.

In FIG. 16, the original signal x(t) is displayed by a square wave having a height 1. Furthermore, the received signal y(t) in FIG. 16 superimposed thereon with the square wave $g_0$ having the height 1 by the direct wave in general and square waves $g_1$-$g_5$ of the ghost signals is produced by a plurality of reflected waves.

Furthermore, the square waves $g_1$, $g_2$, $g_3$, $g_4$ and $g_5$ of the ghost signal produced by the reflected waves which have been superimposed thereon are delayed relative to a square wave $g_0$ by the original signal produced by the direct wave by the delayed times $\Delta t_1$, $\Delta t_2$, $\Delta t_3$, $\Delta t_4$ and $\Delta t_5$. Furthermore, signal levels of the square waves $g_1$, $g_2$, $g_3$, $g_4$ and $g_5$ of the ghost signal are $a_1$, $a_2$, $a_3$, $a_4$ and $a_5$, respectively.

The received signal y(t) shown in FIG. 16 can be expressed in the following equation.

$$y(t) = x(t) + a_1 x(t - \Delta t_1) \quad (2)$$
$$+ a_2 x(t - \Delta t_2)$$
$$+ a_3 x(t - \Delta t_3)$$
$$+ a_4 x(t - \Delta t_4)$$
$$+ a_5 x(t - \Delta t_5)$$

Modifying equation (2), x(t) can be sought in the following equation.

$$x(t) = y(t) + a_1 x(t - \Delta t_1) \quad (3)$$
$$+ a_2 x(t - \Delta t_2)$$
$$+ a_3 x(t - \Delta t_3)$$
$$+ a_4 x(t - \Delta t_4)$$
$$+ a_5 x(t - \Delta t_5)$$

Namely, the ghost signal which has been superimposed on the received signal y(t) can be removed by the operations of equation (3).

Furthermore, when the operations of equation (3) is described on the assumption of the digital process, i.e., described on the assumption of the debunching time system, the following equation can be established.

$$x_k = y_k - \sum_{i=0}^{n} (b_i x_{k-i}) \quad (4)$$

$$b_i = \begin{cases} a_j; i \cdot T_s = \Delta t_j \\ 0: \text{other than the above} \end{cases}$$

There has heretofore been practiced by use of the above-described FIR filter to perform the operations according to the aforesaid equation (3) or (4) for effectively removing the ghost signal from the received signal.

This FIR filter can be realized by the digital filter. In recent years, with the decrease in the costs of digital filters, various ghost cancelers have been developed by the FIR filters formed of the digital filters.

FIG. 17 is a block diagram showing a first example of the ghost canceler using the digital filter.

In FIG. 17, the operations shown in the aforesaid equation (4) is performed. Namely, in FIG. 17, x(t) and y(t) correspond to those in equation (3). Reference numeral 12a designates the FIR filter as shown in FIG. 18. Furthermore, the digital filter shown in FIG. 17 has a feedback loop to the FIR filter 12a, thus presenting an IIR filter as a whole.

FIG. 19 is a block diagram showing a second example of the ghost canceler using the digital filter.

In FIG. 19, an input signal (received signal) inputted through the input terminal IN passes through an FIR filter comprising a digital filter constituted by delay elements of 64 taps, and is inputted into one of two input terminals of the adder A. An output from this adder A is inputted into an FIR filter 12b comprising a digital filter constituted by the delay elements of 576 taps, and an output from FIR filter 12b is inputted in the other of the two input terminals of the aforesaid adder A. Namely, FIR filter 12b and the adder A constitute an IIR filter, and an output from adder A is connected to an output terminal OUT of the ghost canceler as well.

The second example of the ghost canceler particularly has an FIR filter 10 used as an equalizing portion as compared with the aforesaid first example. FIR filter 10 is used for correcting the distortions in the wave forms in a transmission system from a receiving antenna to a television and for removing a ghost close to the main signal within the range of about plus or minus 2 microsecond.

Furthermore, the IIR filter constituted by the adder A and the FIR filter 12b constitutes a ghost cancelling portion in which the operations of the aforesaid equation (3) or (4) are performed, i.e., a plurality of delay signals being different in delay time from one another with the said delay signals made different in signal level from one another are added to thereby remove the ghost signal.

FIG. 20 is a block diagram showing a third example of the ghost canceler using the digital filter.

In FIG. 20, the FIR filter 10 is identical with the FIR filter having the same reference numeral in FIG. 19 and similarly constitutes an equalizing portion.

In FIG. 20, in the ghost canceling portion, 10 to 16 sets of signal delaying parts constituted by variable delayers 14 and FIR filter 12c having delay elements of 7-16 taps are arranged in parallel to one another, and outputs from the respective signal delaying parts, i.e., outputs of the respective variable delayers 14 are added together by the adder A.

The third example of the ghost canceler shown in FIG. 20 is constructed so as to decrease the total number of taps of the FIR filter on the basis of the fact that the number of the multipliers $M_o$-$M_n$, as shown in FIG. 18, having the value "0" is large in the first example of the ghost canceler.

In FIG. 20, in the variable delayer 14, as shown in FIG. 21, fixed delay elements $DF_1$-$DF_n$ are serially connected to one another. Furthermore, in variable delayer 14, the output terminal OUT is connected to a tap selected between the fixed delay elements $DF_1$-$DF_n$, or switched from one tap to another so as to set the delay time.

In the third example of the ghost canceler, as shown in FIG. 22, the removal of ghost signals $g_{11}$-$g_{13}$ which have been superimposed on a main signal $g_{10}$ is performed by three variable delayers 14 and three FIR filters 12c.

Namely, as designated by reference numeral F1 in FIG. 22, a ghost signal $g_{11}$ having a delay time $\Delta t_{11}$ can be removed by the variable delayer VD1 and an FIR filter FIR 1. As denoted by reference numeral F2, a ghost signal $g_{12}$ having a delay time $\Delta t_{12}$ can be removed by the variable delayer VD2 and an FIR filter FIR 2. As indicated by reference numeral F3, a ghost signal $g_{13}$ having a delay time $\Delta t_{13}$ can be removed by the variable delayer VD3 and an FIR filter FIR 3. Namely, these ghost signals $g_{11}$-$g_{13}$ can be removed by the number of taps of the FIR filters totalling to about $(7 \times 3 --- 16 \times 3 = 48)$.

Incidentally, theoretically, one tap is sufficient for a removal of one ghost. However, practically, the ghost has the spread, so that 7-16 taps (fixed number) are allocated to one ghost.

As described above, according to the third example of the ghost canceler, the total number of taps of the FIR filters, which is relatively small, can remove the ghost signal, whereby the total number of multipliers used can be reduced, thus reducing the costs.

However, the first and second examples of the aforesaid ghost canceler are characterized in that the plurality of delay signals having the delay times different from one another are formed into a composite output signal with the delay times and the signal levels being selected widely, and the ghost signals having various delay times and various signal levels can be effectively removed, while these examples have such a problem that the multi-tap FIR filter must be used.

The above-described multi-tap FIR filter requires a multiplicity of multipliers, thus presenting the problem of increasing the cost of the ghost canceler as a whole.

On the other hand, the third example of the ghost canceler as shown in FIG. 20 offers the advantage that the number of taps used in FIR filter may be small, thus reducing the cost of the ghost canceler as a whole. However, since the number of the FIR filters to be used and the number of taps of each of the FIR filters are limited, the number and spreads of ghost to be removed are limited, and, such problems are presented that, when a multiplicity of ghost signals having the delay times and the signal levels, which are different from one another are superimposed on the received signals, all of the ghosts cannot be removed, or the ghost signal having a large spread cannot be fully removed. Furthermore, such a problem is presented that 7-16 taps are uniformly allocated to a narrow ghost requiring only a small number of taps.

SUMMARY OF THE INVENTION

The present invention has been developed to obviate the above-described conventional problems and has as its object the provision of a digital filter with a relatively small number of multipliers and a reduced cost, wherein a plurality of delay signals having delay times different from one another can be formed into a composite output signal with the delay times and signal levels being selected widely.

To achieve the above-described object, according to the present invention, in a digital filter wherein a plurality of delay elements are used to obtain an output signal composed of a plurality of delay signals being different in delay time from one another and different in signal level from one another, the digital filter comprises: a plurality of multipliers for outputting the inputted signal levels as the desired signal levels; and a signal selecting means for selectively connecting the plurality of delay elements and the plurality of multipliers; whereby the said signal selecting means is selectively switched on or off to obtain the output signal composed of the plurality of delay signals being different in delay time from one another.

Furthermore, to achieve the above-described object, the plurality of delay elements are serially connected to one another, taps for obtaining delay signals for respective delay times are provided at respective connecting portions, respective outputs from the plurality of multipliers are added together by an adder, the result is outputted to an output terminal of the digital filter, and the signal selecting means are selectively switched on or off between the plurality of taps and the input terminals of the plurality of multipliers.

Furthermore, to achieve the above-described object, the signal selecting means are provided between the plurality of taps and the input terminals of the plurality of multipliers, and the signal selecting means are selectively switched on or off between the corresponding taps and the corresponding input terminals of the multipliers.

Furthermore, to achieve the above-described object, the signal selecting means are provided between the plurality of taps and the input terminals of the plurality of multipliers, there is provided a switch for switching on or off between the corresponding taps and the corresponding multipliers and an adder for adding the signals on the sides of the multipliers of the switch to outputs from the other signal selecting means, and, when the said switch of the plurality of signal selecting means is switched on to an output of a multiplier, the signals from the taps corresponding to these signal selecting means are added and inputted into the multiplier.

Furthermore, to achieve the above-described object, the signal inputted into the digital filter is inputted into each of the plurality of multipliers, the plurality of delay elements and a plurality of adders for introducing delay input signals are alternately and serially connected to one another, and the signal selecting means are switched on or off between the output terminals of the plurality of multipliers and an input terminal of an adder out of the plurality of adders, for selection.

Furthermore, to achieve the above-described object, the signal selecting means are provided between output terminals of the plurality of multipliers and input terminals of the plurality of adders, and the signal selecting means are switched on or off between the corresponding output terminals of the plurality of multipliers and the corresponding input terminals of the plurality of adders.

Furthermore, to achieve the above-described object, the adders are formed of multi-input adders, the signal selecting means are provided between the output terminals of the plurality of multipliers and the input terminals of the plurality of adders, and the signal selecting means are switched on or off between the corresponding output terminals of multipliers and the corresponding input out of multiple inputs of the corresponding adders.

Furthermore, to achieve the above-described object, multi-input adders are provided at respective input terminals of the plurality of multipliers, the signal selecting means are provided between the plurality of taps and the plurality of adders, and the signal selecting means are switched on or off between the corresponding taps and the corresponding input out of the multiple inputs of the corresponding adders.

Furthermore, to achieve the above-described object, the signal selecting means has an adder for adding together the results of selection of said signal selecting means and the result of selection of other signal selecting means.

According to the present invention, in the digital filter using a plurality of delay elements, a plurality of multipliers for outputting signal levels of the inputted signals as desired signal levels, and particularly, signal selecting means are provided for being switched on or off between the plurality of delay elements and the plurality of multipliers, for selection. Accordingly, even when a multiplicity of delay elements are arranged, with a small number of multipliers as compared the number of these delay elements, it is possible to form a composite output signal by selecting the delay times and signal levels widely.

Namely, according to the present invention, for example, the number of the multipliers is sufficient only if the number corresponds to at least the number of the signal levels of the delay signals having the respective delay times, which are to be formed into a composite signal (provided that, as in an element to be described hereunder, the number of the multipliers can be further reduced). Accordingly, there have heretofore been used about 500 multipliers (this number is far larger than the number of the signal levels of the delay signals which are to be formed into a composite signal) in a digital filter having 500 delay elements, for example, so that, according to the present invention, the number of the multipliers used in a digital filter can be decreased to a great extent.

According to the present invention, the signal selecting means, in which the multipliers of a relatively small number are switched for selection so as to be utilized effectively, can be realized by use of switching elements, adders and the like, for example. In these switching elements, adders and the like, which are frequently used in the present invention, the number of elements such as transistors used is far smaller than those used in the multiplier.

Accordingly, the number of the multipliers used in the digital filter is reduced, whereby, even when a signal selecting means is required anew, the manufacturing cost of the digital filter can be reduced as a whole.

Furthermore, according to the present invention, the delay elements used can be effectively utilized, whereby the numbers of the delay elements, variable delay elements and the like are reduced, so that the costs can be reduced.

Incidentally, according to the present invention, the relationship of connection and the arrangement between the plurality of delay elements, the plurality of multipliers and the signal selecting means are not limited.

Namely, the signal selecting means may be of such an arrangement that the signal selecting means used is switched on or off between the plurality of delay elements and the plurality of multipliers, whereby dynamic switching is made between the plurality of display elements and the plurality of multipliers, so that the coefficients of multiplication of the respective multipliers and the like can be changed and the delay times and signal levels can be effectively and widely selected.

Furthermore, the signal selecting means according to the present invention are not limited to the switching elements, adders and the like. Only if the signal selecting means can be dynamically switched on or off between the plurality of delay elements and the plurality of multipliers, both of which constitute the digital filter, for selection as described above, it has the advantages of the present invention.

DESCRIPTION OF THE PREFERRED EMBODIMENTS

The embodiments of the present invention will hereunder be described in detail with reference to the accompanying drawings.

Figure 1:
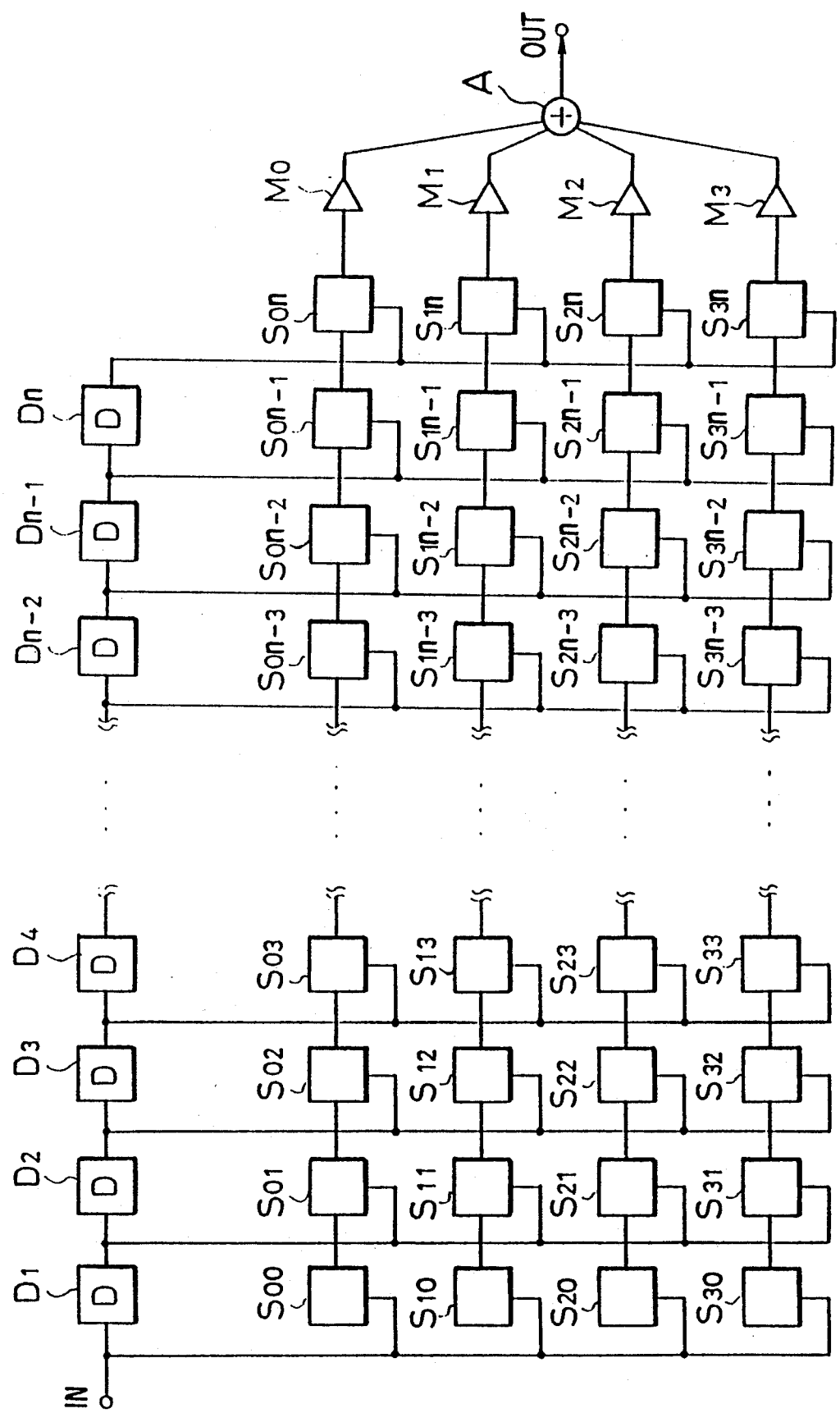
FIG. 1 is a block diagram showing a first embodiment of the FIR filter to which is applied the present invention.

FIG. 1 is a block diagram showing a first embodiment of the FIR filter to which is applied the present invention.

Referring to FIG. 1, a filter input signal inputted into an input terminal IN is inputted into a delay element $D_1$ and four signal selecting means $S_{00}$–$S_{30}$, respectively.

The delay elements $D_1$–$D_n$ having the delay times equal to one another and totalling to n are serially connected to one another and provided at connecting portions of the respective delay elements with taps for obtaining delay signals.

For example, four signal selecting means $S_{01}$–$S_{31}$ are connected to a tap portion where an output terminal of the delay element $D_1$ is connected to an input terminal of the delay element $D_2$. Furthermore, four signal selecting means $S_{02}$–$S_{32}$ are connected to a tap portion where an output terminal of the delay elements $D_2$ is connected to an input terminal of the delay element $D_3$. Furthermore, four signal selecting means $S_{03}$–$S_{33}$ are connected to a tap portion where an output terminal of the delay element $D_3$ is connected to an input terminal of the delay element $D_4$. As described above, four signal selecting means are connected to each of the tap portions of the connecting portions of the plurality of delay elements serially connected one another, respectively. Namely, the signal selecting means $S_{00}$–$S_{3n}$ totalling to $4\times(n+1)$ are connected to the delay elements $D_1$–$D_n$ totalling to n.

Further, all of these signal selecting means $S_{00}$–$S_{3n}$ are divided into four groups, cascade-connected, respectively, and connected to any one of multipliers $M_0$–$M_3$. Namely, the signal selecting means $S_{00}$–$S_{0n}$ totalling to $(n+1)$ are cascade-connected and the signal selecting means $S_{0n}$ at the last stage is connected to the input terminal of the multiplier $M_0$. Furthermore, the signal selecting means $S_{10}$–$S_{1n}$ totalling to $(n+1)$ are cascade-connected, and the signal selecting means $S_{1n}$ at the last stage is connected to the input terminal of the multiplier $M_1$. Furthermore, the signal selecting means $S_{20}$–$S_{2n}$ totalling to $(n+1)$ are cascade-connected, and the signal selecting means $S_{2n}$ at the last stage is connected to the input terminal of the multiplier $M_2$. Furthermore, the signal selecting means $S_{30}$–$S_{3n}$ totalling to $(n+1)$ are cascade-connected, and the signal selecting means $S_{3n}$ at the last stage is connected to the input terminal of the multiplier $M_3$.

Outputs of these four multipliers $M_0$–$M_3$ are inputted into an adder A and an output from this adder A is outputted into an output terminal OUT as a filter output signal.

Figure 2:
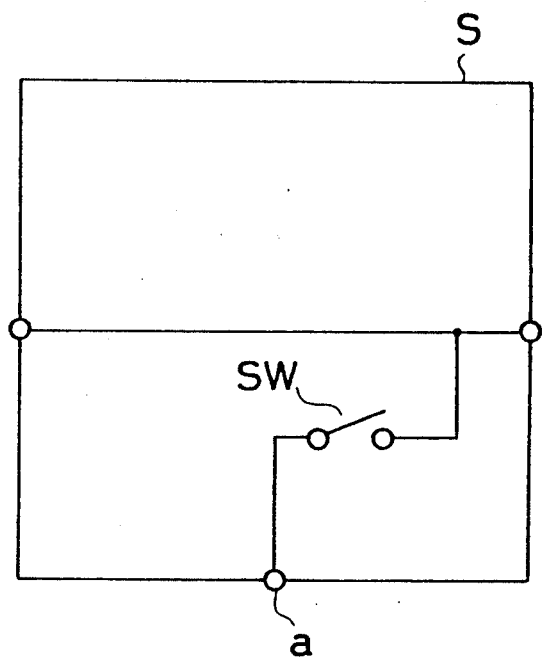
FIG. 2 is a block diagram showing the signal selecting means used in the first embodiment.

FIG. 2 is a block diagram showing the signal selecting means used in the first embodiment.

Referring to FIG. 2, a signal selecting means S (corresponding to one of the signal selecting means $S_{00}$–$S_{3n}$ in FIG. 1) is formed of a switching element SW.

Positions of three terminals of the signal selecting means S in FIG. 2 are constructed corresponding to positions of three terminals of each of the signal selecting means $S_{00}$–$S_{3n}$ in FIG. 1. Namely, for example, a terminal a at the bottom of the signal selecting means S in this FIG. 2 corresponds to terminals at the bottoms of the signal selecting means $S_{00}$–$S_{3n}$ connected to the tap portions of each of the connecting portions of the delay elements serially connected to one another in FIG. 1.

According to the first embodiment of the present invention as shown in FIGS. 1 and 2, the four multipliers are effectively used to realize a digital filter capable of forming at least four delay signals different in signal level and delay time from one another into a composite signal. For example, any one of the signal selecting means totalling to $(n+1)$ corresponding to each of the multipliers $M_0$–$M_3$ is switched on, whereby each of the only four multipliers $M_0$–$M_3$ can be connected to any one of the tap portions (the output terminals of the delay elements $D_1$–$D_n$).

Figure 19:
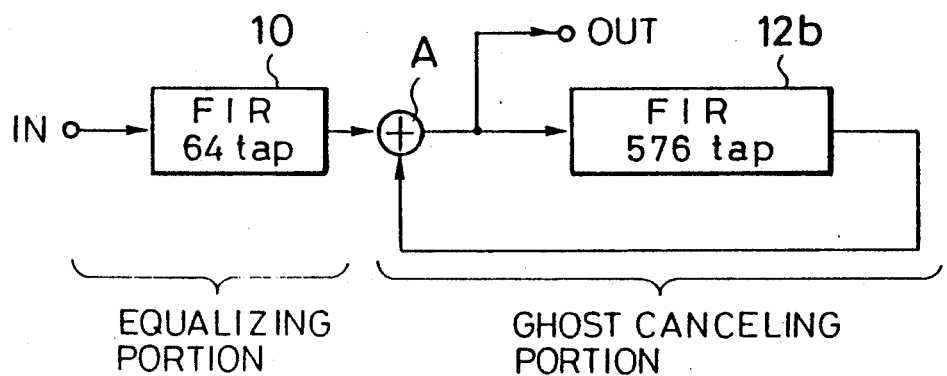
FIG. 19 is a block diagram showing a second example of the conventional ghost canceler using the digital filter.

Incidentally, the numbers of the delay elements and the multipliers are not limited to those shown in the first embodiment. For example, the inventor of the present invention experimentally manufactured several types of the FIR filters according to the first embodiment, wherein the number of the delay elements is made to be 500-600 and the number of the multipliers about 100, and used the FIR filters of these several types in the first example of the ghost canceler as shown in FIG. 19. The trially manufactured FIR filters of the first embodiment can reduce 400-500 of multipliers as compared with the conventional FIR filter using the delay elements of 500-600 taps, thus reducing the cost greatly.

Figure 20:
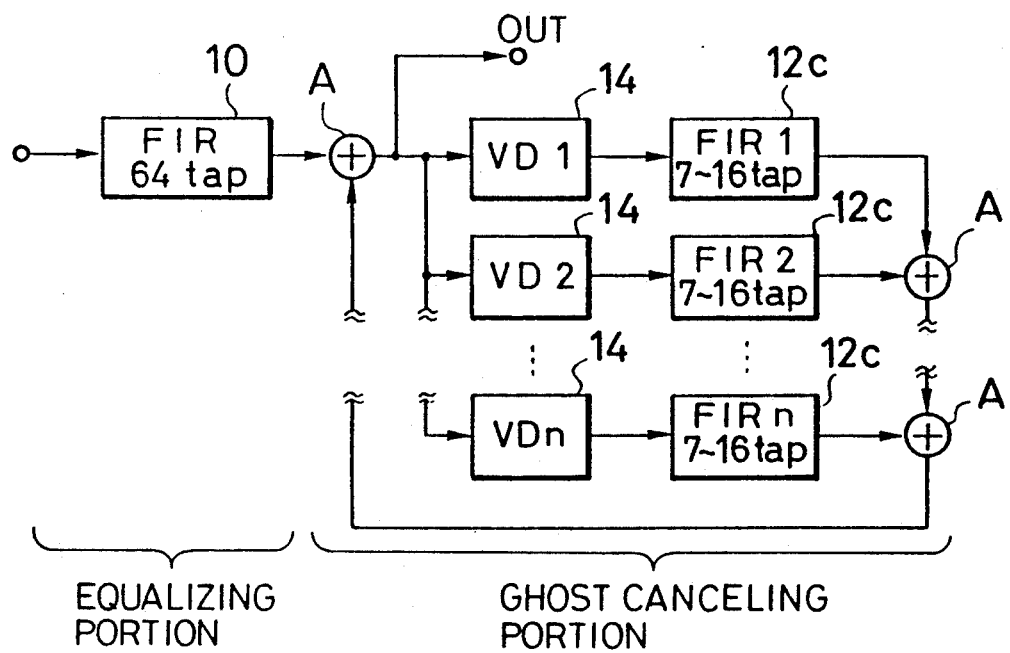
FIG. 20 is a block diagram showing a third example of the conventional ghost canceler using the digital filter.
Figure 21:
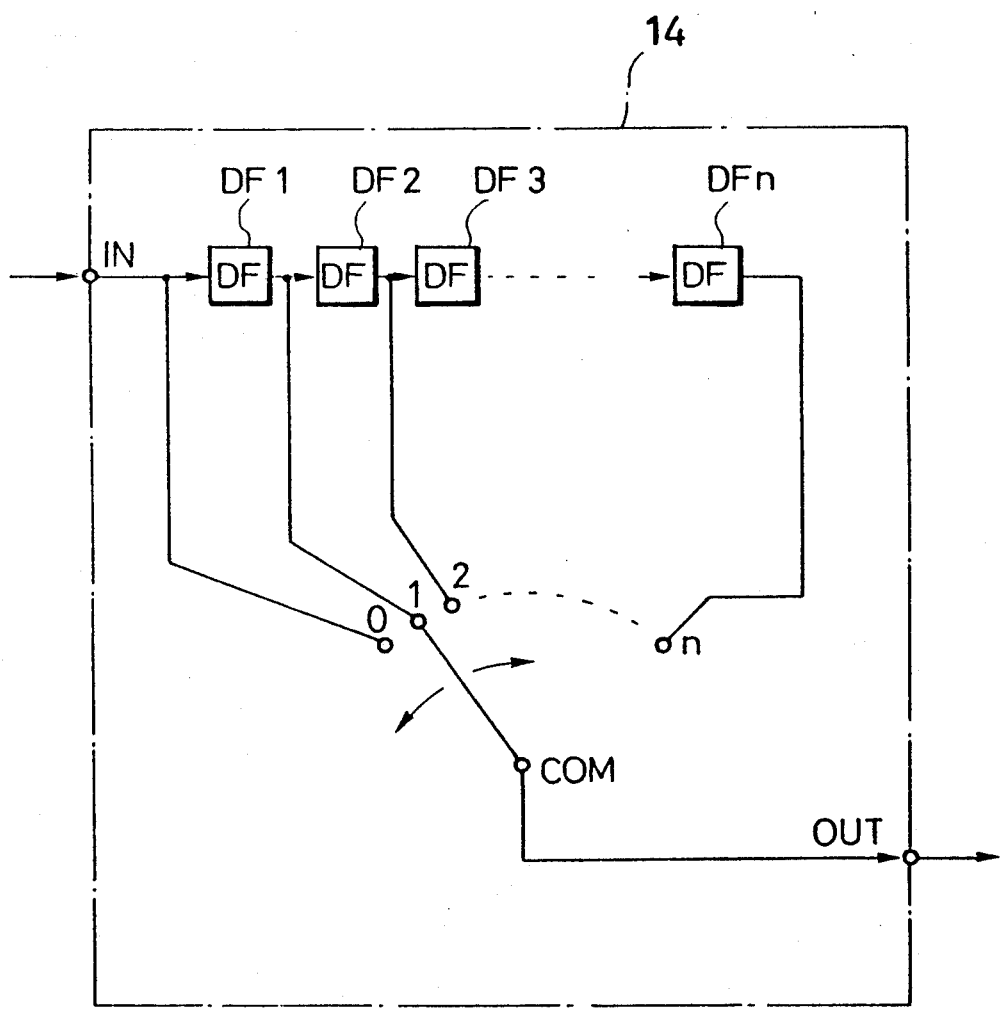
FIG. 21 is a circuit diagram showing variable delay lines used in the third example of the conventional ghost canceler.
Figure 22:
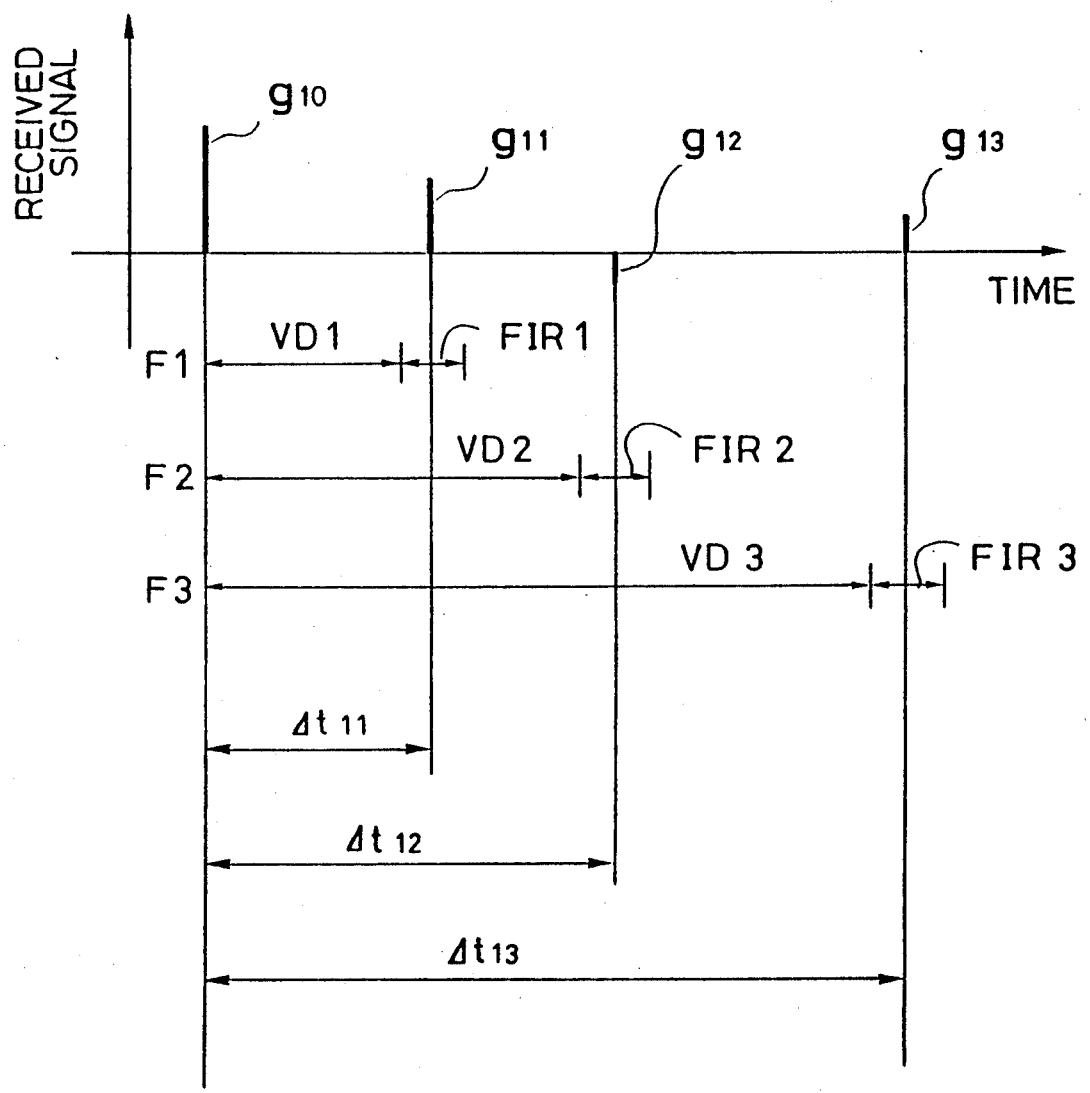
FIG. 22 is a graphic chart showing the removal of the ghost signal in the third example of the conventional ghost canceler.

Furthermore, for example, when there are used the multipliers equal in number to those in the third example of the aforesaid conventional ghost canceler as shown in FIG. 20, in this embodiment, the multiplier can be freely allocated to the optimal tap, whereby a ghost wide in the width of delay time, a ghost narrow in the width of delay time and more ghosts can be effectively and more completely removed.

Figure 3:
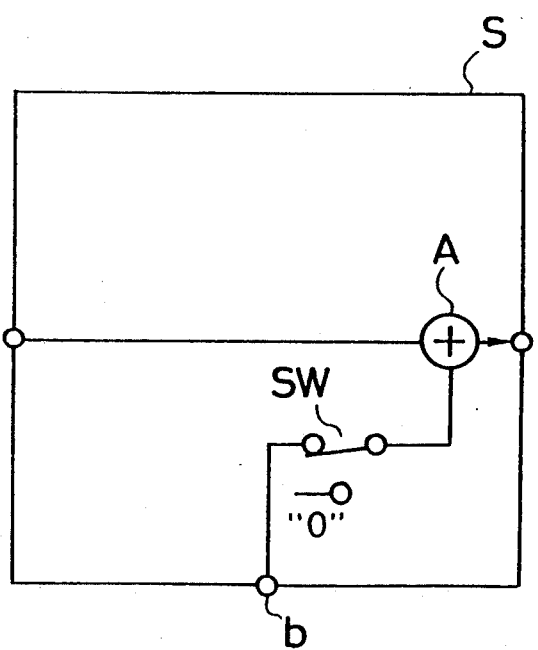
FIG. 3 is a block diagram showing the signal selecting means used in a second embodiment of the present invention.

FIG. 3 is a block diagram showing the signal selecting means used in a second embodiment of the present invention.

Referring to FIG. 3, the signal selecting means S is constituted by one switching element SW and one adder A.

Positions of three terminals of the signal selecting means S in FIG. 3 are constructed corresponding to positions of three terminals of each of the signal selecting means $S_{00}$-$S_{3n}$ in FIG. 1. Namely, for example, terminal b at the bottom of the signal selecting means S in FIG. 3 corresponds to terminals at the bottoms of the signal selecting means $S_{00}$-$S_{3n}$ connected to the tap portions of each of the connecting portions of the delay elements serially connected to one another in FIG. 1.

According to the second embodiment of the present invention as illustrated in FIGS. 1 and 3, when the same coefficient is to be applied to several output terminals of the taps, only one multiplier is sufficient with the adder, so that the multipliers can be effectively used. In contrast thereto, the multipliers as many as the number of taps are required with only one switching element SW as in the first embodiment.

Figure 4:
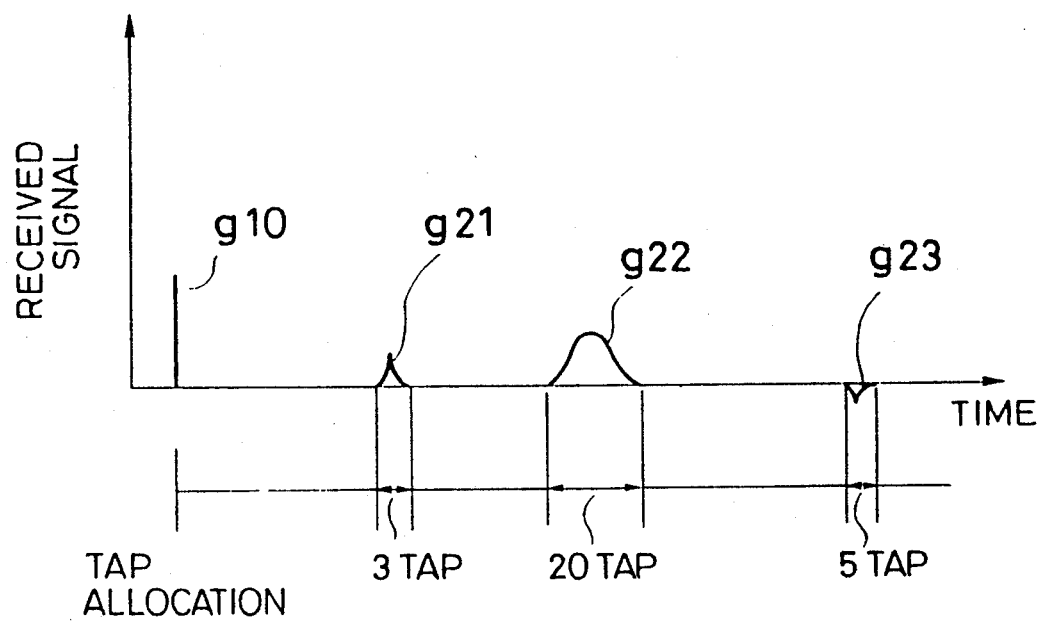
FIG. 4 is a wave form diagram of the received signal in which the ghost signals are superimposed on the main signal.
Figure 5:
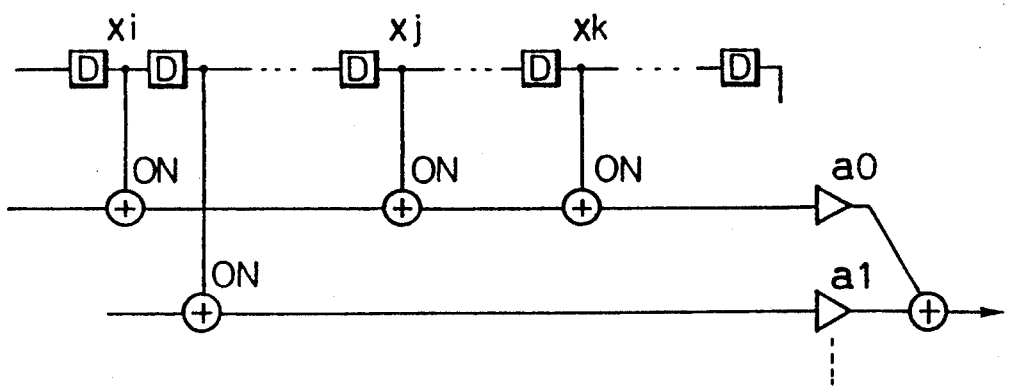
FIG. 5 is a circuit diagram showing an example of connections in the second embodiment.

For example, when ghost signals $g_{21}$-$g_{23}$ to the main signal $g_{20}$ as shown in FIG. 4 are removed, taps totalling to (3+20+5=28) are used, and, among these 28 taps, there is a possibility that the same coefficient is allocated. For example, when signals $x_i$, $x_j$ and $x_k$ are multiplied by the same coefficient $a_0$, the following equation can be established, and, in this embodiment, the number of the multipliers used can be reduced from three to one.

$$\underbrace{a_0 x_i + a_0 x_j + a_0 x_k}_{\text{three multipliers (the first embodiment)}} = \underbrace{a_0 (x_i + x_j + x_k)}_{\text{one multiplier (this embodiment)}}$$

Figure 6:
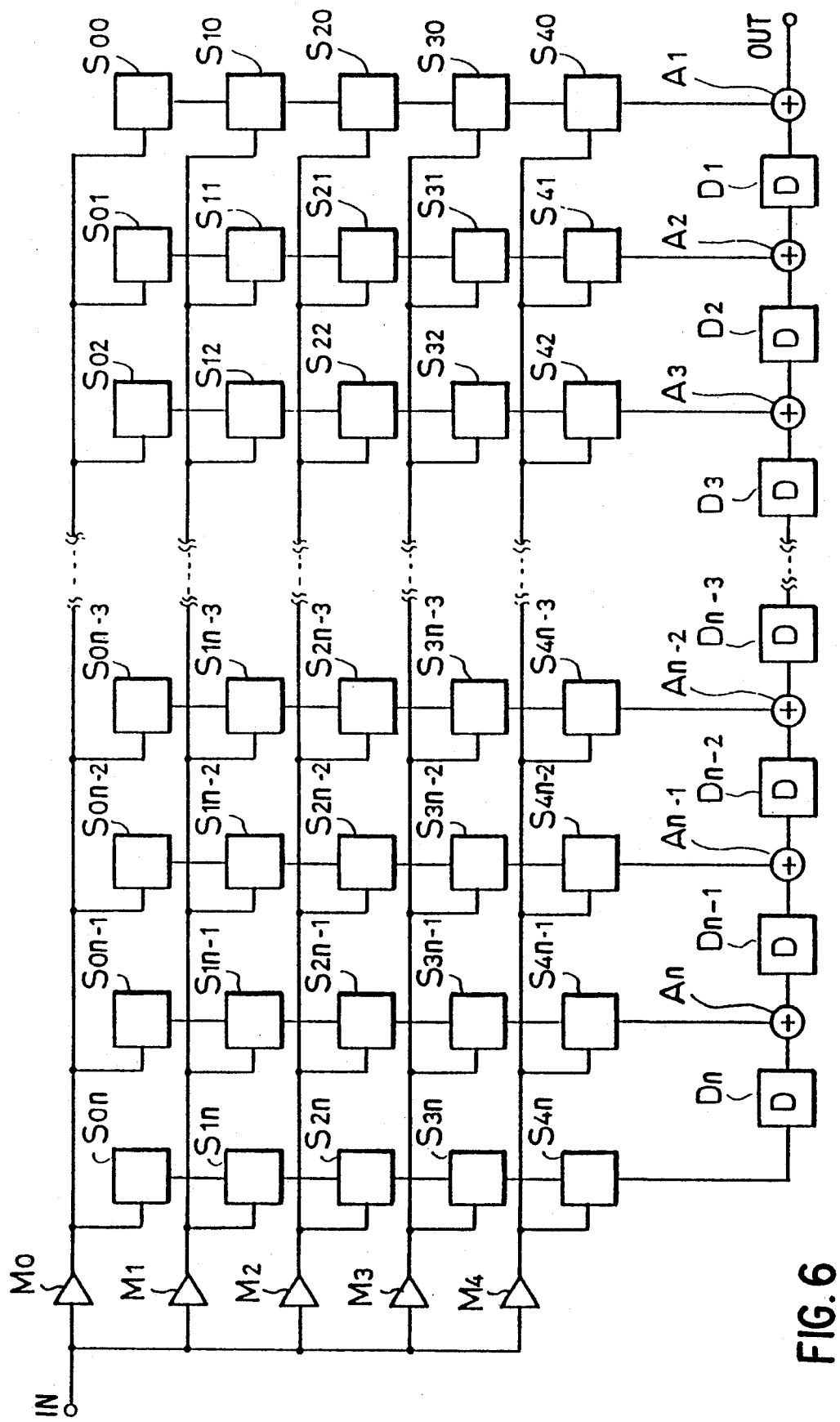
FIG. 6 is a block diagram showing a third embodiment of the FIR filter to which is applied the present invention.

FIG. 6 is a block diagram showing a third embodiment of the FIR filter to which is applied the present invention.

If the arrangement of the embodiment shown in FIG. 1 is regarded as a basic type, then the arrangement of this third embodiment may be regarded as a transposed type. Accordingly, this third embodiment can offer substantially the same advantages as the first embodiment using the signal selecting means shown in FIG. 2.

Referring to FIG. 6, inputted into the input terminal IN is the filter input signal which in turn is inputted into the multipliers $M_0$-$M_4$ totalling to five.

An output from the multiplier $M_0$ is inputted into the signal selecting means $S_{00}$-$S_{0n}$ totalling to (n+1), respectively. Furthermore, an output from the multiplier $M_1$ is inputted into the signal selecting means $S_{10}$-$S_{1n}$ totalling to (n+1), respectively. Furthermore, an output from the multiplier $M_2$ is inputted into the signal selecting means $S_{20}$-$S_{2n}$ totalling to (n+1), respectively. Furthermore, an output from the multiplier $M_3$ is inputted into the signal selecting means $S_{30}$-$S_{3n}$ totalling to (n+1), respectively. Furthermore, an output from the multiplier $M_4$ is inputted into the signal selecting means $S_{40}$-$S_{4n}$ totalling to (n+1), respectively.

The delay elements $D_1$-$D_n$ totalling to n together with adders $A_1$-$A_n$ totalling to n for introducing the delay output signals are alternately and serially connected to one another. Each one of the signal selecting means $S_{4n}$-$S_{40}$ is successively connected to an input terminal of the delay element $D_n$ at the left end and the input terminals of the adders $A_n$-$A_1$ totalling to n.

Furthermore, the output terminals of the five multipliers $M_0$-$M_4$, the input terminal of the delay element $D_n$ and the input terminals of the adders $A_n$-$A_1$ totalling to n can be switchingly and selectively connected with each other by the signal switching means $S_{0n}$-$S_{00}$, $S_{1n}$-$S_{10}$, $S_{2n}$-$S_{20}$, $S_{3n}$-$S_{30}$, $S_{4n}$-$S_{40}$ totalling to 5×(n+1) arranged in a matrix manner. With this arrangement, any one of outputs from the five multipliers $M_0$-$M_4$ can be selectively inputted into the input terminal of the delay element $D_n$ and the input terminals of the adders $A_n$-$A_1$, so that a plurality of delay signals having delay times and signal levels different from one another can be formed into a composite signal. Furthermore, the adder $A_1$ at the last stage outputs the filter output signal into the output terminal OUT.

Figure 7:
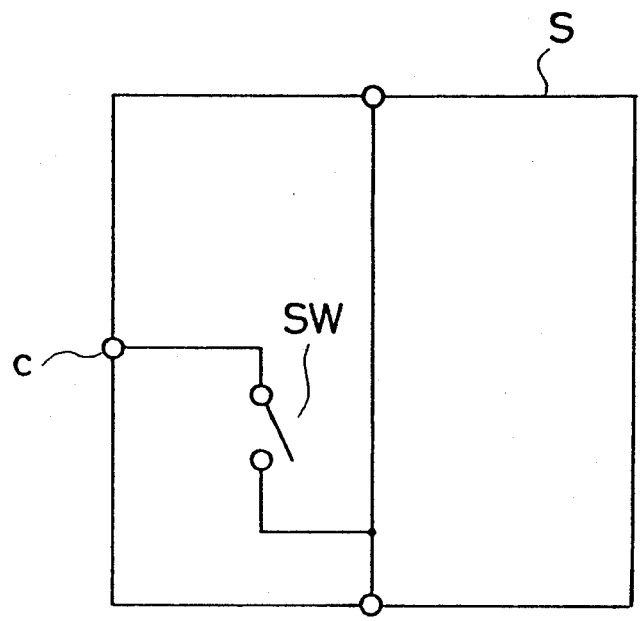
FIG. 7 is a block diagram showing the signal selecting means used in the third embodiment.

FIG. 7 is a block diagram showing the signal selecting means used in the third embodiment.

Referring to FIG. 7, the signal selecting means S is formed of one switching element SW.

Furthermore, positions of three terminals of the signal selecting means S shown in FIG. 7 are constructed corresponding to positions of three input terminals of each of the signal selecting means $S_{00}$-$S_{4n}$ in FIG. 6. Namely, for example, a terminal c in the left of the signal selecting means S in FIG. 7 corresponds to terminals in the left of the signal selecting means $S_{00}$-$S_{4n}$ connected to any one of the output terminals of the multipliers $M_0$-$M_4$ shown in FIG. 6.

According to the third embodiment of the present invention as shown in FIGS. 6 and 7, with only the five multipliers $M_2$-$M_4$ using the delay elements $D_1$-$D_n$ totalling to n, for example, at least five delay signals having delay times and signal levels different from one another are formed into a composite signal to be obtained as the filter output signal.

Incidentally, the present invention is not limited to the number of the multipliers and the number of the delay elements as shown in the embodiments. For example, the inventor of the present invention has experimentally manufactured the FIR filter of the third embodiment, which is used in the first example of the aforesaid ghost canceler as shown in FIG. 19, wherein 500-600 delay elements and 100 multipliers are used. According to the FIR filter for the ghost canceler in the third embodiment, the number of the multipliers can be reduced by 400-500 as compared with the conventional FIR filter for the ghost canceler using 500-600 delay elements, thus reducing the costs.

Incidentally, as an example of modification of the third embodiment, the signal selecting means S having the adder A used in the second embodiment and shown in FIG. 3 may be used for the signal selecting means $S_{00}$-$S_{4n}$. According to the above-described example of modification, a plurality of outputs from the multipliers $M_0$-$M_4$ can be added and the results can be inputted to each of the adders $A_1$-$A_n$.

Accordingly, in the above-described example of modification, by use of the multipliers $M_0$-$M_4$ limited in the number of use, signals having more various signal levels can be obtained and inputted into the respective adders $A_1$-$A_n$.

Figure 8:
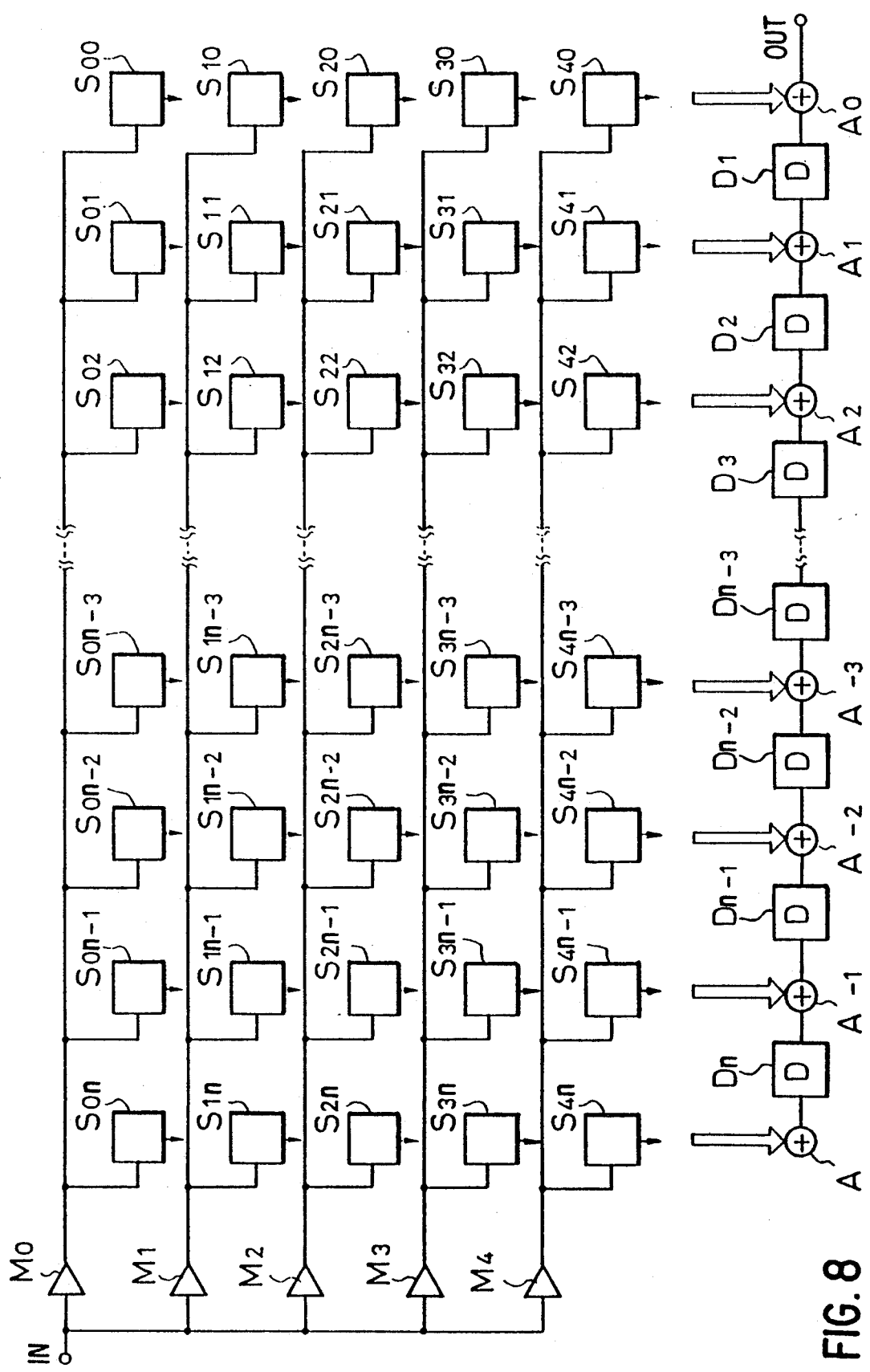
FIG. 8 is a block diagram showing a fourth embodiment of the FIR filter to which is applied the present invention.

FIG. 8 is a fourth embodiment of the FIR filter to which is applied the present invention.

If the arrangement of the embodiment shown in FIG. 1 is a basic type, then the arrangement of this fourth embodiment is a transposed type. Accordingly, this fourth embodiment can offer substantially the same advantages as the second embodiment using the signal selecting means shown in FIG. 3.

In FIG. 8, reference numerals $M_0$-$M_4$, $D_n$-$D_1$, IN and OUT are identical with those having the same reference numerals as shown in FIG. 6.

In FIG. 8, the adders $A_n$-$A_0$ are multi-input ones and all of the outputs of the signal selecting means $S_{0i}$-$S_{4i}$ in the longitudinal direction and the outputs of fixed delay $D_{i+1}$ at the respective preceding stages are successively added together for outputting.

Figure 9:
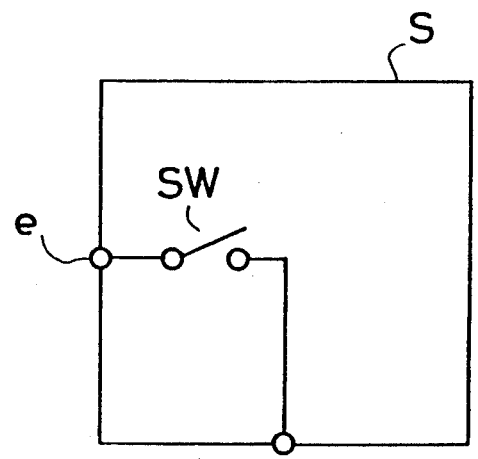
FIG. 9 is a circuit diagram showing the signal selecting means used in the fourth embodiment.

FIG. 9 is a circuit diagram showing the signal selecting means used in the fourth embodiment.

In FIG. 9, the signal selecting means S is formed of one switching element SW.

Furthermore, positions of two terminals of the signal selecting means S shown in FIG. 9 correspond to positions of two terminals of each of the aforesaid signal selecting means $S_{00}$-$S_{4n}$ in FIG. 8. Namely, for example, a terminal e in the left of the signal selecting means S shown in FIG. 9 corresponds to a terminal in the left of each of signal selecting means $S_{00}$-$S_{4n}$ shown in FIG. 8, the said terminal being connected to one of outputs of the multipliers $M_0$-$M_n$.

Figure 10:
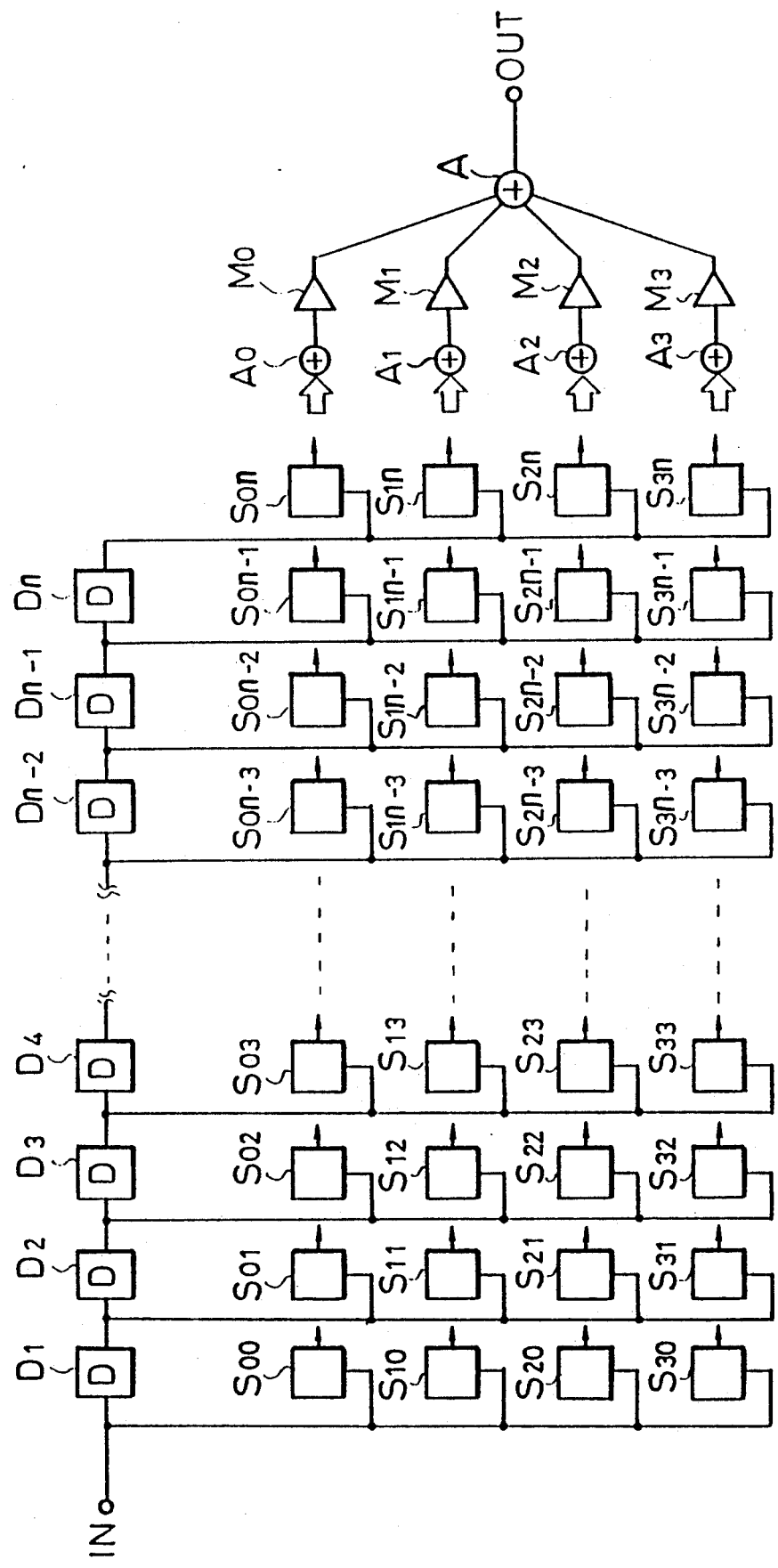
FIG. 10 is a block diagram showing a fifth embodiment of the FIR filter to which is applied the present invention.

FIG. 10 is a block diagram showing a fifth embodiment of the FIR filter to which is applied the present invention.

This fifth embodiment, using only four adders $A_0$-$A_3$, can offer substantially the same advantages as the second embodiment using the signal selecting means shown in FIG. 3. Namely in this fifth embodiment, adding is not performed at the stages in the lateral direction, but is combinedly performed in the adders $A_0$-$A_3$.

In FIG. 10, the delay elements $D_1$-$D_n$, the multipliers $M_0$-$M_3$, the adder A, the input terminal IN and the output terminal OUT are identical with those having the same reference numerals in FIG. 1 and are constructed similarly. Furthermore, the respective signal selecting means $S_{00}$-$S_{3n}$ are disposed at the positions similar to those of the signal selecting means $S_{00}$-$S_{3n}$ having the same reference numerals in FIG. 1.

Figure 11:
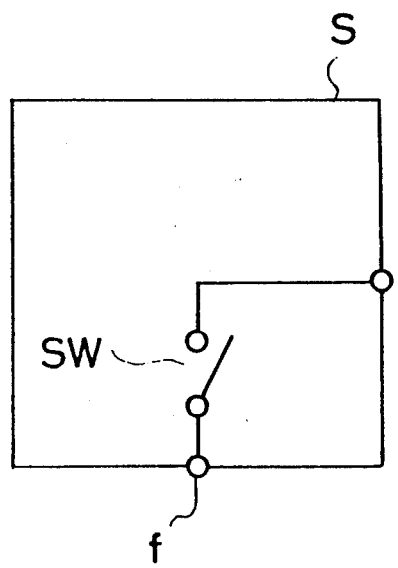
FIG. 11 is a circuit diagram showing the signal selecting means used in the fifth embodiment.

FIG. 11 is a circuit diagram of the signal selecting means used in the fifth embodiment.

In FIG. 11, the signal selecting means S is formed of one switching element SW.

Furthermore, positions of two terminals of the signal selecting means S shown in FIG. 11 are constructed corresponding to positions of two terminals of each of the signal selecting means $S_{00}$-$S_{3n}$ shown in FIG. 10. Namely, for example, a terminal f at the bottom of the signal selecting means S shown in FIG. 11 corresponds to a terminal at the bottom connected to the respective tap portions of the respective connecting portions of the delay element out of the terminals of each of the signal selecting means $S_{00}$-$S_{3n}$ in FIG. 10.

Figure 12:
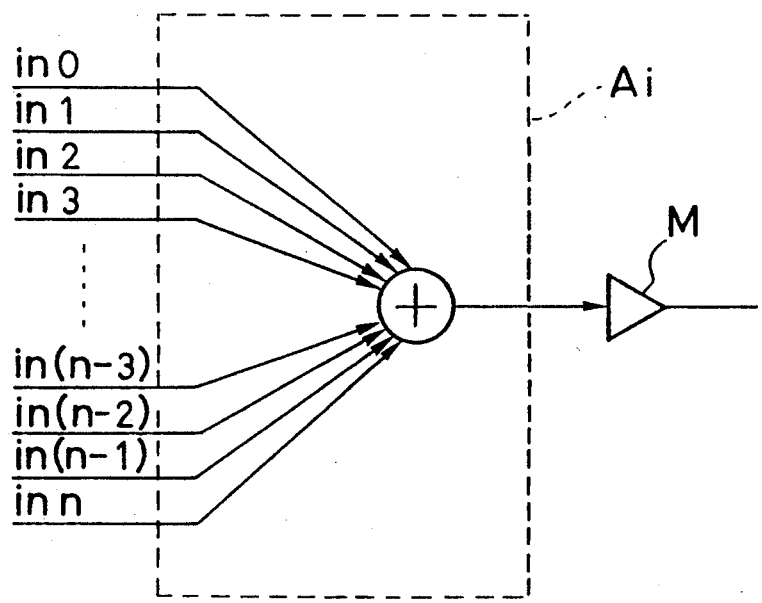
FIG. 12 is a circuit diagram showing the adder used in the fifth embodiment.

FIG. 12 is a block diagram showing the adder used in the fifth embodiment.

Namely, the adder $A_i$ shown in FIG. 12 represents each of the adders $A_0$-$A_3$ shown in FIG. 10.

The adder $A_i$ shown in FIG. 12 is a multi-input adder for adding the signals inputted into the input terminals of the inputs $in_0$-$in_n$ totalling to $n+1$.

According to the fifth embodiment of the present invention as shown in FIGS. 10, 11 and 12, even if an adder is not provided in each of the signal selecting means $S_{00}$-$S_{3n}$ totalling to $4\times(n+1)$ as in the aforesaid second embodiment, the signal levels of a plurality of delay signals having delay times different from one another can be widely selected.

Figure 13:
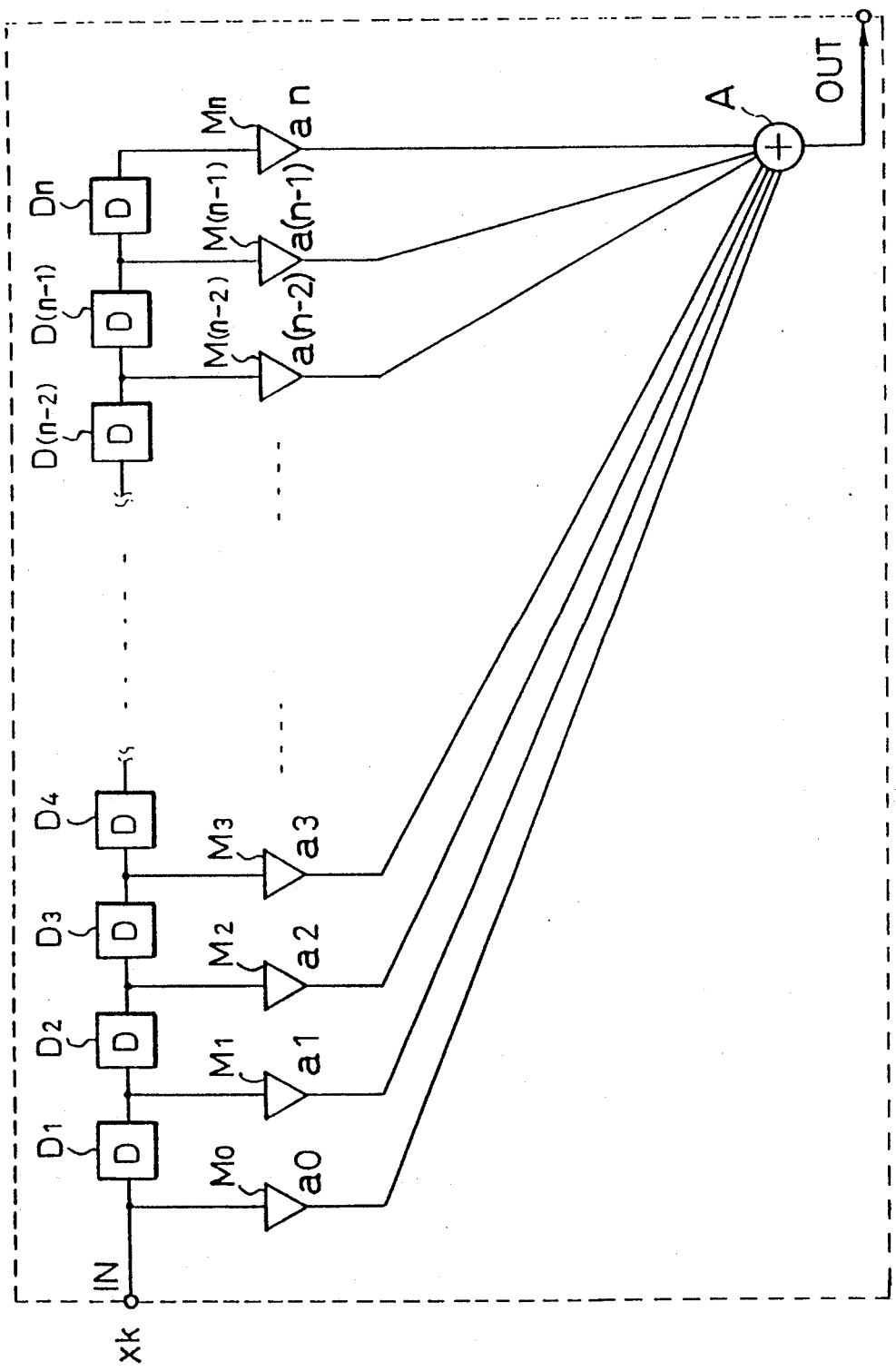
FIG. 13 is a block diagram showing the conventional FIR filter.
Figure 14:
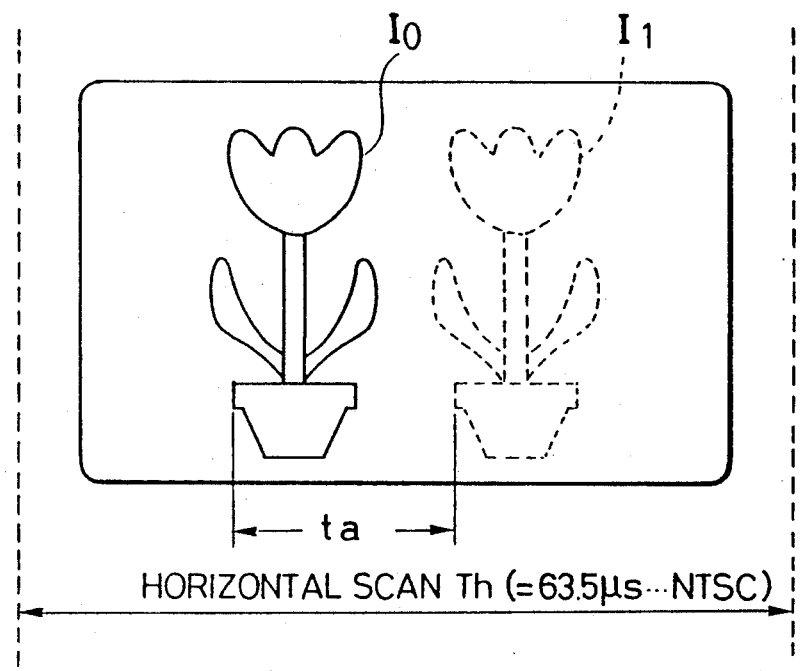
FIG. 14 is an explanatory view of the ghost screen in which the ghost signal together with the main signal are superimposed on the received signal.
Figure 15:
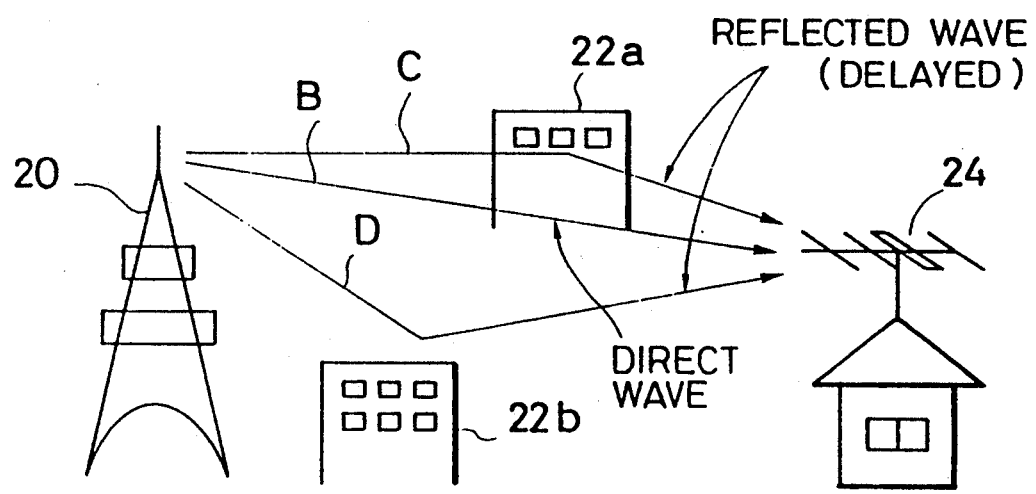
FIG. 15 is a view of electric wave propagation for explaining the process of generation of the ghost.
Figure 16:
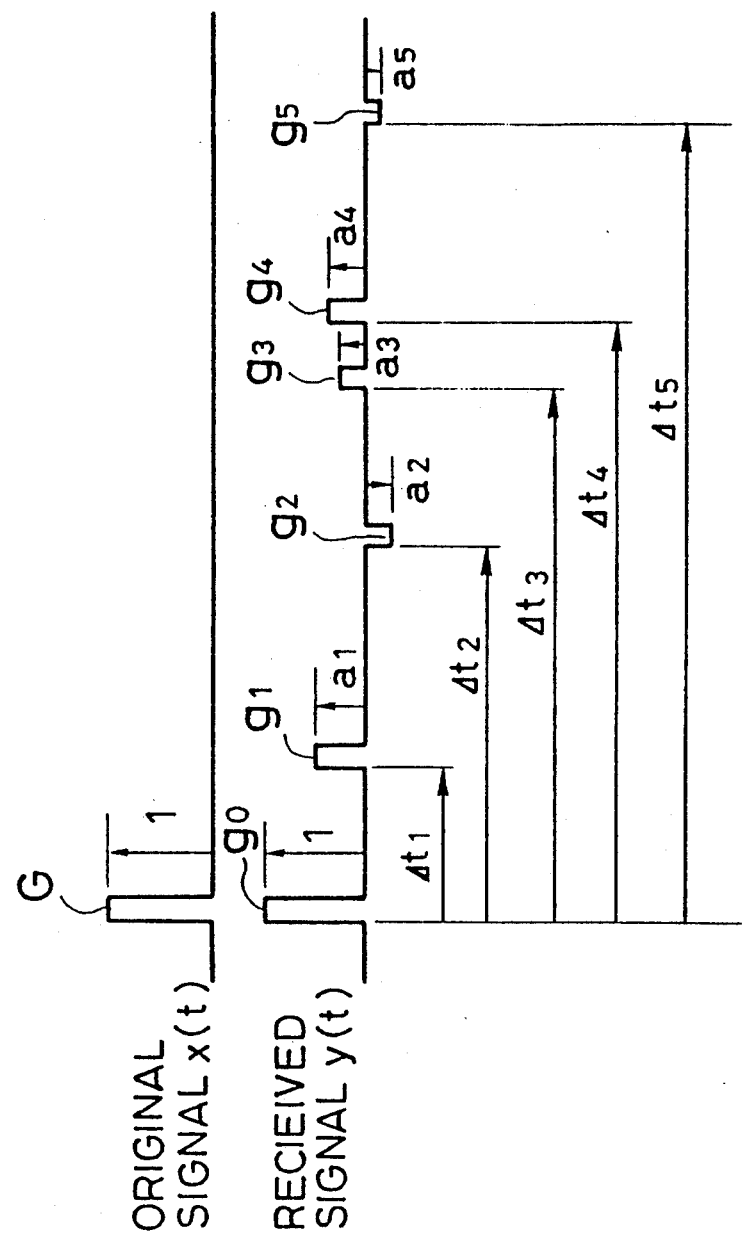
FIG. 16 is a wave form diagram showing the original signal and the received signal in which the ghost signal is superimposed on the main signal corresponding to the original signal.
Figure 17:
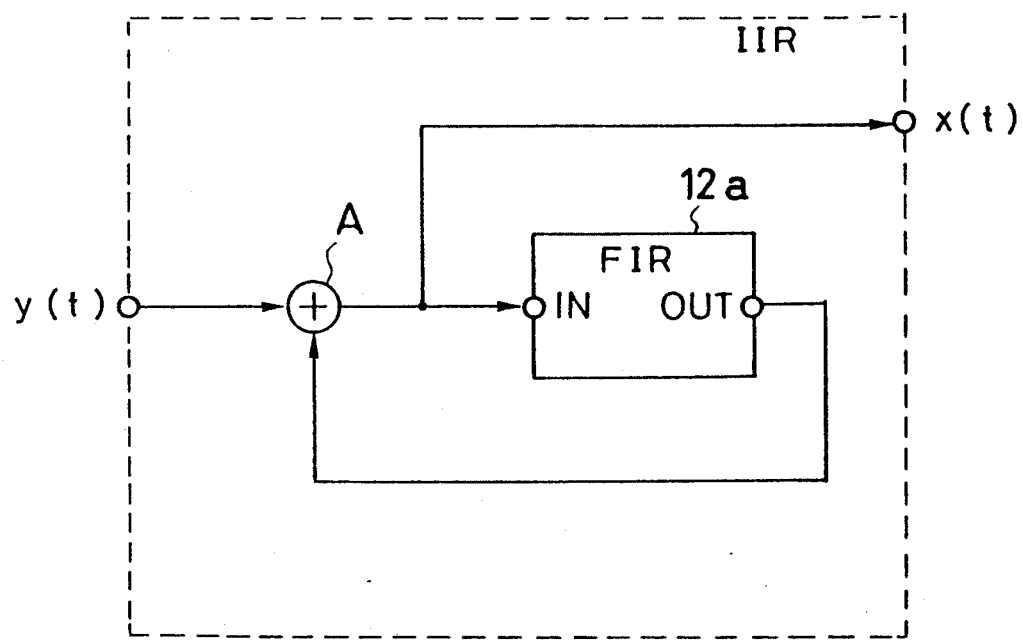
FIG. 17 is a block diagram showing a first example of the conventional ghost canceler using the digital filter.
Figure 18:
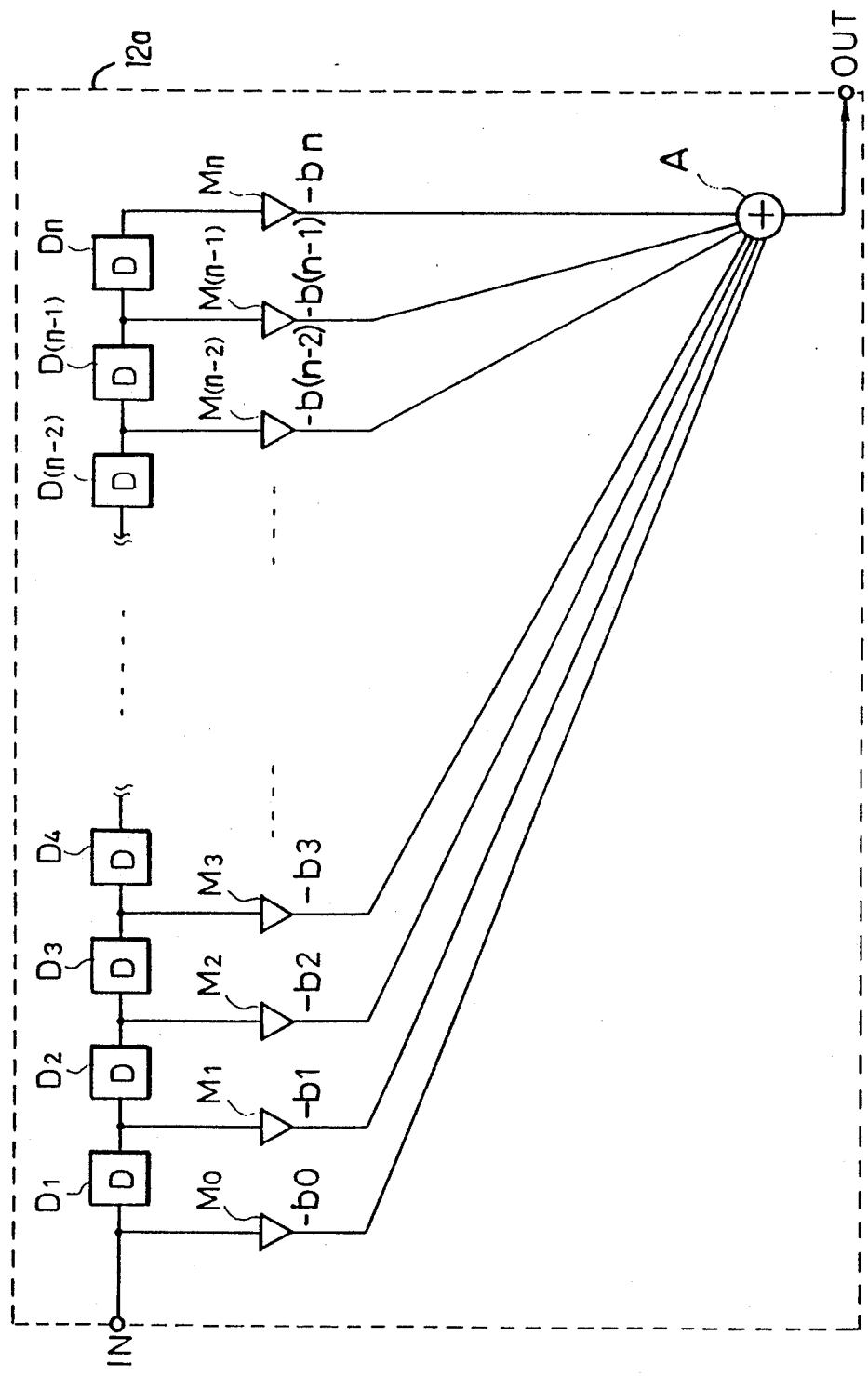
FIG. 18 is a block diagram showing the FIR filter used in the first example of the conventional ghost canceler.

Incidentally, the numbers of the delay elements, the multipliers and the signal selecting means as used in the present invention are not limited to the respective numbers in the first embodiment through the fifth embodiment of the present invention as described above. Furthermore, the FIR filters in the first embodiment through the fifth embodiment of the present invention have substantially the same functions of the conventional FIR filters described above using FIG. 13, and, it is needless to say that the filters in the first to fifth embodiments can be used as the FIR filter in the first example of the ghost canceler shown in FIG. 19 and as the FIR filter in the second example of the ghost canceler shown in FIG. 20.

What is claimed is:

1. A digital filter for producing an output signal based on an input signal and an intermediate signal, the intermediate signal comprising a plurality of delay signals, each of said delay signals having different delay times, the digital filter comprising:

an input terminal for receiving the input signal;
a serially connected tapped delay line connected to the input terminal, alternatingly comprising n taps and n−1 delay elements, each of the n−1 delay elements outputting one delay signal of the intermediate signal, each delay signal having a different delay time;
a switching circuit for receiving the input signal and the intermediate signal from the n taps and the n−1 delay signals, the switching circuit comprising a plurality of switches arranged in a matrix having n columns and m rows, each of the plurality of switches having a switched input, an output and a switch element selectively connecting the switched input to the output, the switched input of each of the m switches of each of the n columns connected in parallel to one of the n taps for receiving one of the input signal and the n−1 delay signals;
a first adding circuit comprising m first adders, each of the m first adders associated with a corresponding one of the m rows of the matrix and having n inputs, each of the n inputs being connected to the output of one of the n switches of the corresponding row, each first adder outputting a sum of output signals of the n switches of the corresponding row as a first sum output signal;

a multiplier circuit comprising m multipliers, each of the m multipliers associated with one of the m first adders for inputting the first sum output signal of the one first adder and outputting a multiplied signal; and a second adder having m inputs for inputting and summing the multiplied signals of the m multipliers and outputting the output signal, wherein the switching circuit is controlled to selectively connect at least one of the n taps to one of the m first adders.

2. A digital filter for producing an output signal based on an input signal and an intermediate signal, the intermediate signal comprising a plurality of delay signals, each of said delay signals of the intermediate signal having different delay times, the digital filter comprising:

an input terminal for receiving the input signal;

a serially connected tapped delay line connected to the input terminal, alternatingly comprising n taps and n−1 delay elements, each of the n−1 delay elements outputting one of the delay signals of the intermediate signal, each delay signal having a different delay time, the n taps providing the input signal and the n−1 delay signals to a switching circuit;

the switching circuit comprising a plurality of switches arranged in a matrix having n columns and m rows, a switched input of each of the m switches of each of the n columns parallelly connected to one of the n taps for receiving one of the input signal and the n−1 delay signals as a switched input signal, the n switches of each of the m rows being serially connected, wherein each of the plurality of switches comprises the switched input, an adder connected to an output for outputting a summed signal, an unswitched input connected to the adder for inputting a summed signal from a serially upstream switch, and a switch element for selectively connecting one of the switched input signal and a predetermined signal to the adder;

a multiplier circuit comprising m multipliers, each of the m multipliers associated with a corresponding one of the m rows for inputting the summed signal from a last one of the n switches of the corresponding row and outputting a multiplied signal; and an adder having m inputs for inputting and summing the multiplied signals of the m multipliers and outputting the output signal, wherein the switching circuit is controlled to selectively connect at least one of the taps to one of the m multipliers.

3. A digital filter for producing an output signal based on an signal, the output signal comprising a plurality of delay signals, each of said delay signals having different delay times, the digital filter comprising:

an input terminal for receiving the input signal;

a multiplier circuit comprising m multipliers, each of the m multipliers receiving the input signal and outputting a multiplied signal;

a switching circuit comprising a plurality of switches arranged in a matrix having n columns and m rows, each of the plurality of switches having a switched input, an output for outputting an output signal and a switch element for selectively connecting the switched input to the output, the switched input of each of the n switches of each of the m rows connected in parallel to one of the m multipliers for receiving the multiplied signal of the one multiplier; and a serially connected delay line, alternatingly comprising n adders and n−1 delay elements, each of the n−1 delay elements outputting as a delay signal an input signal delayed by a same delay time, wherein each one of the n−1 delay elements receives a summed output signal from an upstream adder as an input signal and outputs the delay signal of the one delay element to a downstream adder, each one of the n adders is associated with one of the n column of the switching matrix and has n+1 inputs, each of the n+1 inputs being connected to one of an upstream delay element and the output of one of the m switches of said column for outputting a sum of the delay signal of the upstream delay element and the output signals of the m switches as the summed output signal of the one adder, the summed output of the nth adder being the output signal, and wherein the switching circuit is controlled to selectively connect at least one of the m multipliers to at least one of the n adders.

4. A digital filter for producing an output signal based on an input signal, the output signal comprising a plurality of delay signals, each of said delay signals having different total delay times, the digital filter comprising:

an input terminal for receiving the input signal;

a multiplier circuit comprising m multipliers, each of the m multipliers receiving the input signal and outputting a multiplied signal;

a switching circuit comprising a plurality of switches arranged in a matrix having n columns and m rows wherein one of the m multipliers is associated with a corresponding one of the m rows, each of the plurality of switches comprising a first adder connected to an output for outputting a first summed signal, an unswitched input connected to the adder for inputting the first summed signal from a serially upstream switch, and a switched input for receiving a switched input signal and a switch element for selectively connecting one of the switched input signal and a predetermined signal to the adder, the n switches of each of the m rows parallel connected to one of the m multipliers for receiving the multiplied signal of the one multiplier as the switched input signal; and a serially connected delay line, alternatingly comprising n second adders and n−1 delay elements, each of the n−1 delay elements outputting a delay signal delayed by a same delay time, wherein each one of the n−1 delay elements inputs and delays by the same delay time a second summed output signal from an upstream second adder, the second summed output comprising at least one of a first summed output and at least one upstream delay signal, and outputs the delay signal of the one delay element, such that each at least one upstream delay signal is further delayed, each one of the n second adders is associated with a corresponding one of the n column of the switching matrix and has at least one of two inputs, a first input being connected to an upstream delay element and a second input being connected to the first summed output of a last switch of the corresponding column for outputting a sum of the delay signal and the first summed output signals as the second summed output signal of the one second adder, the second summed output of a last second adder being the output signal, and wherein the switching circuit is controlled to selectively connect at least one of the m multipliers to at least one of the n second adders.

* * * * *

UNITED STATES PATENT AND TRADEMARK OFFICE
CERTIFICATE OF CORRECTION

PATENT NO. : 5,212,660
DATED      : May 18, 1993
INVENTOR(S): Junichi Orihara

It is certified that error appears in the above-indentified patent and that said Letters Patent is hereby corrected as shown below:

Column 15, line 50, change "one of the taps" to
     --one of the n taps--; and line 52, change "on an signal" to
     --on an input signal--.

Column 16, line 42, change "parallel" to
     --parallelly--; and line 59; change "n column" to
     --n columns--.

Signed and Sealed this

Fifteenth Day of March, 1994

Attest:

BRUCE LEHMAN

Attesting Officer    Commissioner of Patents and Trademarks